United States Patent [19]
Lacourcelle

[11] Patent Number: 5,721,414
[45] Date of Patent: Feb. 24, 1998

[54] METHOD OF MANUFACTURING A SPARK EROSION ELECTRODE WIRE

[75] Inventor: L. Lacourcelle, Saint Jean de la Blaquière, France

[73] Assignee: Thermocompact, Société Anonyme, Metz Tessy, France

[21] Appl. No.: 622,582

[22] Filed: Mar. 26, 1996

[30] Foreign Application Priority Data

Mar. 27, 1995 [FR] France ................... 95 03756

[51] Int. Cl.$^6$ .................................................. B23H 7/08
[52] U.S. Cl. ........................... 219/69.12; 148/526; 219/50
[58] Field of Search ............................ 219/69.12, 155, 219/50; 148/526, 532, 533; 427/319

[56] References Cited

U.S. PATENT DOCUMENTS

| | | | |
|---|---|---|---|
| 3,313,269 | 4/1967 | Hough | 219/155 |
| 4,287,404 | 9/1981 | Converts et al. | 219/69.12 |
| 4,595,600 | 6/1986 | Keeven et al. | 427/319 |
| 4,924,050 | 5/1990 | Hermanni | 219/69.12 |
| 4,977,303 | 12/1990 | Briffod | 219/69.12 |

FOREIGN PATENT DOCUMENTS

| | | |
|---|---|---|
| 0185492 | 6/1986 | European Pat. Off. . |
| 0312674 | 4/1989 | European Pat. Off. . |
| 2418699 | 3/1982 | France . |
| 54-141490 | 11/1979 | Japan ................ 219/69.12 |
| 5-337741 | 12/1993 | Japan . |
| 5-337742 | 12/1993 | Japan . |
| 1553245 | 9/1979 | United Kingdom . |

OTHER PUBLICATIONS

Patent Abstracts of Japan, vol. 012 No. 223 (C–507), Jun. 24, 1988, JP–A–63 018072, The Furukawa Electric Co., Ltd., Jan. 25, 1988.

*Primary Examiner*—Geoffrey S. Evans
*Attorney, Agent, or Firm*—Ratner & Prestia

[57] ABSTRACT

An entry wire passes through a furnace containing zinc vapor in an inert atmosphere. While passing through the furnace the wire is heated by the Joule effect, by passing through it an electrical current produced by a generator, which rapidly heats it to the appropriate temperature. This produces an electrode wire having a thicker surface layer of diffused copper-zinc alloy, so that spark erosion machining is accelerated. The manufacturing method is fast and low in cost.

10 Claims, 1 Drawing Sheet

METHOD OF MANUFACTURING A SPARK EROSION ELECTRODE WIRE

BACKGROUND OF THE INVENTION

1. Field of the Invention

The present invention concerns electrode wires used for spark erosion machining of metal parts.

2. Description of the Prior Art

In this machining process, as described for example in document FR-A-2 418 699, an electrode wire is moved along a path near a metal part to be machined. An electric generator produces a potential difference between the part to be machined and the metal electrode wire. Sparking occurs in the machining area between the electrode wire and the metal part and progressively erodes the part and the wire.

The speed of spark erosion machining depends among other things on the nature of the materials from which the electrode wire is made.. The rate of machining has been increased by using an electrode wire with a surface layer of diffused copper-zinc alloy. For example, documents EP-A-0 185 492 and EP-A-0 312 674 teach the manufacture of an electrode wire by a method comprising at least the following two successive steps, in order to increase the speed of spark erosion machining: electrolytically depositing a layer of appropriate thickness onto the exterior of a copper-plated steel wire; then heating the wire coated in this way with a layer of zinc to diffuse the zinc and the copper into each other and so to produce a surface layer of diffused copper-zinc alloy. Document U.S. Pat. No. 4,977,303 teaches a similar method in which the surface layer of the wire is simultaneously oxidized.

Although these methods yield improved results, they still have major drawbacks which include: methods with two successive steps (depositing zinc and then thermal diffusion) are relatively slow, which limits the rate of production of the wire; the electrolytic deposition of zinc requires relatively complex plant which, although well proven in general, is relatively bulky and requires constant supervision; the rate of production of the wire is limited by current density constraints during electrolytic deposition; the rates of diffusion of the metals are not very high, which makes it difficult to reconcile a sufficiently high rate of production and sufficient diffusion of the metals; this problem is all the more severe if the requirement is for an electrode wire with a surface layer of copper-zinc alloy having a high proportion of zinc to a great depth (exceeding ten microns).

Document JP-A-63 018072 discloses a method of manufacturing electrode wire by depositing zinc onto a brass wire in a furnace containing zinc vapor at about 600° C.

The problem to which the present invention is addressed is that of further improving spark erosion performance by providing and using a wire with a deeper layer of diffused copper-zinc alloy, combined with an increase in the rate of manufacture of the wire in order to reduce its manufacturing cost.

The invention is also directed to simplifying the method of manufacturing electrode wire for possible use on a spark erosion machine whereby the wire is manufactured continuously on the entry side of the spark erosion area and at the appropriate feed rate for the spark erosion machining.

In the description and the claims the expression "diffused copper-zinc alloy" refers to a metal alloy containing copper and zinc obtained by diffusion of zinc into the copper or the copper alloy.

SUMMARY OF THE INVENTION

To achieve the above and other objects, the present invention provides a method of manufacturing spark erosion electrode wire wherein zinc is applied to at least one entry wire of copper or copper alloy or any other material covered with copper or copper alloy and a surface layer of diffused copper-zinc alloy is produced by thermal diffusion of zinc into the thickness of the copper or copper alloy of the entry wire, which method comprises a step during which the entry wire is passed at least once through a furnace containing zinc vapor in an inert atmosphere at a temperature greater than approximately 600° C. while the wire is heated by additional heat input so that in the furnace its temperature rapidly rises to a value promoting diffusion of zinc into the thickness of the entry wire but less than the melting point of the entry wire, said step producing directly, after cooling at the exit from the furnace, said wire with a surface layer of diffused copper-zinc alloy.

In an advantageous embodiment, the additional heat input is obtained by the Joule effect, by passing an appropriate electrical current through the portion of the wire passing through the furnace. In this way the temperature of the wire in the furnace can be monitored and controlled. The wire may be further heated on leaving the furnace for a further time enabling increased diffusion of zinc. In this way, and either alternatively or additionally, the input wire can be pre-heated to an appropriate temperature to prevent condensation of zinc on the wire when it enters the furnace.

The wire made in this way is found to have a slightly rough surface, although the surface is much less rough than a wire made by the traditional process of depositing a layer of zinc followed by diffusion brought about by heating. The surface of the wire obtained in accordance with the invention is just rough enough for spark erosion, requiring no mechanical surface treatment apart from sizing.

Because spark erosion machining uses electrode wires with a strictly controlled outside diameter, a mechanical sizing operation is generally required as the last manufacturing step. This mechanical sizing operation advantageously reduces the diameter of the wire by only a relatively small amount, such that the ratio of the wire diameters before and after sizing is greater than 0.9. This further increases the relative depth of the diffused alloy surface layer, and this depth is not significantly reduced if the sizing is by only a relatively small amount.

The invention provides a device for implementing this method of making an electrode wire for spark erosion having a surface layer of diffused copper-zinc alloy by processing one or more entry wires of copper or copper alloy or any other material covered with copper or copper alloy, characterized in that it comprises:

- a sealed furnace having a peripheral wall around an interior cavity with at least one sealed entry and at least one sealed exit and means for continuously moving the entry wire or wires at least once through the cavity of the furnace which they enter via the entry or entries and leave via the exit or exits,
- means for maintaining a temperature exceeding approximately 600° C. in the cavity of the furnace,
- means for generating zinc vapor in an inert atmosphere in the cavity of the furnace,
- means for additional input of heat to the portion or portions of wire passing through the furnace to heat them rapidly to a temperature promoting the diffusion of zinc into the thickness of the entry wire or wires.

In an advantageous embodiment the additional heat input means comprise means for passing a controlled electrical current through the wire portion passing through the furnace so that the wire is heated by the Joule effect.

An electrode wire obtained by a method in accordance with the invention preferably comprises a thick surface layer of diffused copper-zinc alloy.

The wire can comprise a copper or copper alloy core. Alternatively, the wire can comprise a central member covered by an outer layer of copper or copper alloy itself covered with said surface layer of diffused alloy of zinc and copper or copper alloy.

Other objects, features and advantages of the present invention will emerge from the following description of a specific embodiment given with reference to the appended figures.

DETAILED DESCRIPTION OF THE PREFERRED EMBODIMENT

Figure 1:
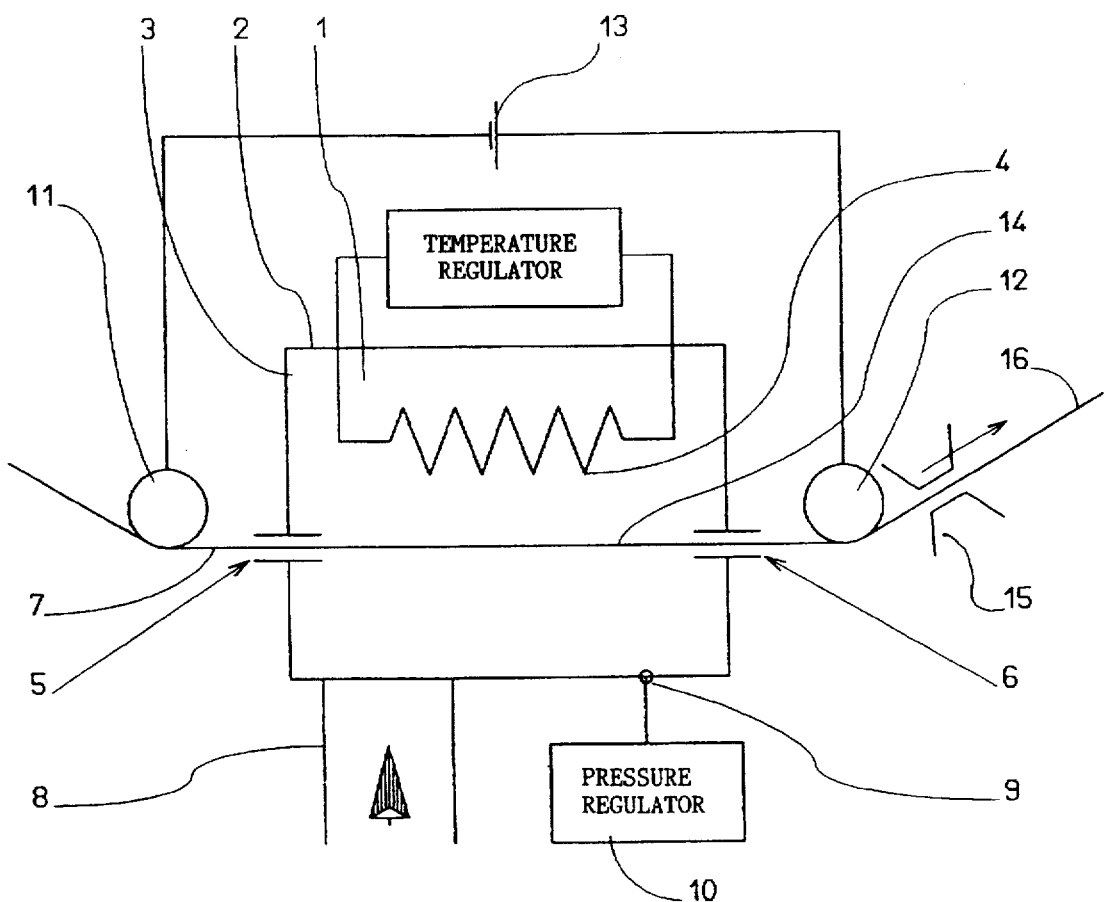
FIG. 1 is a diagrammatic representation of a device for making a spark erosion electrode wire.

In the embodiment shown in FIG. 1 a device for making an electrode wire for spark erosion comprises a sealed furnace 1 including a peripheral wall 2 surrounding an interior cavity 3. Controlled heating means 4 maintain the interior cavity 3 of the furnace 1 at a temperature above approximately 600° C., for example between about 600° C. and 800° C. The peripheral wall 2 of the furnace 1 includes a sealed entry 5 and a sealed exit 6 for an input wire 7 which at the output constitutes the spark erosion electrode wire 16. Wire transfer means, not shown in the figure, hold the wire 7 and move it continuously one or more times through the cavity 3 of the furnace 1 between the entry 5 and the exit 6. In the embodiment shown in FIG. 1 the entry 5 is opposite the exit 6. Alternatively, the entry 5 and the exit 6 can be side by side, on the same side of the furnace, or coincident.

The furnace 1 further comprises means for generating zinc vapor in an inert atmosphere in the cavity 3 of the furnace 1. To this end a zinc loader 8 introduces metallic zinc into the furnace 1 in the appropriate quantity to produce saturated zinc vapor in the cavity 3. The inert atmosphere may be a neutral gas such as nitrogen or argon, for example, the pressure of which is regulated by a pressure sensor 9 associated with a pressure regulator 10 that can be of any known type.

Near the entry 5 of the furnace 1 the inlet wire 7 touches an entry contact 11. Similarly, near the exit 6 of the furnace 1 the wire 16 touches an exit contact 12. The contacts 11 and 12 are connected to respective terminals of an electrical current generator 13 for passing an electrical current through the wire, in particular the portion 14 of the wire passing through the furnace 1, in order to heat it by the Joule effect. The current can advantageously be set to heat the portion 14 of the wire 7 passing through the furnace 1 to red heat. This provides electrical means of procuring additional heat input into the portion 14 of wire passing through the cavity 3 of the furnace 1.

The contacts 11 and 12 can be in the immediate vicinity of the entry 5 and the exit 6 of the furnace 1, respectively, so that only the portion 14 of the wire passing through the cavity 3 of the furnace 1 is heated.

If required, the entry contact 11 can be outside the furnace 1, away from the entry 5, to pre-heat the entry wire 7 before it enters the furnace 1. The entry wire 7 can advantageously be pre-heated to an appropriate temperature to prevent the condensation of zinc on the wire when it enters the furnace 1. This obtains the full benefit of the rapid diffusion of zinc vapor into the thickness of the entry wire 7, unimpeded by a surface layer of zinc.

Similarly, the exit contact 12 can be outside the furnace 1 and away from the exit 6, to further heat the exit wire 16 for increased diffusion of the zinc into the thickness of the wire.

At its exit end the device may include a sizing die for setting the mechanical dimension of the wire 16 leaving the furnace 1.

In the manufacture of a spark erosion electrode wire by means of a device as shown in FIG. 1, the inlet wire 7 is passed at least once through the furnace 1 containing zinc vapor in an inert atmosphere at a temperature exceeding approximately 600° C., additional heat input to the wire being obtained by virtue of the electrical current produced by the generator 13, with the result that the temperature of the wire is rapidly increased to a value promoting the diffusion of zinc into the thickness of the wire, but below the melting point of the entry wire 7. The entry wire 7 comprises an outer layer of copper or copper alloy. After passing through the furnace 1 the wire comprises an outer layer of diffused copper-zinc alloy.

If the exit contact 12 is away from the exit 6 from the furnace 1, the wire is further heated for a further time enabling diffusion of the zinc to be completed.

Good results are obtained if the wire is heated to red heat as it passes through the furnace 1.

The temperature inside the furnace 1 can advantageously be such that, given the wire feed rate, the wire passing through it is heated to a temperature between 700° C. and 800° C. Good results are obtained with a wire temperature around 750° C., which enables relatively rapid treatment, without being too close to the melting point of copper.

The method may advantageously comprise a preliminary step of degreasing and/or cleaning the entry wire 7 by chemical or electrochemical means before it enters the furnace 1.

The method is compatible with the treatment of an entry wire 7 having a diameter substantially equal to the required final diameter of the electrode wire. The rate of application and diffusion of the zinc, which is very high with the method of the invention, is compatible with the required rate of manufacture of the wire 16. The treatment of an entry wire 7 having substantially the required exit wire size enables the depth of the surface layer of diffused copper-zinc alloy to be increased. In this case the possible subsequent operation of sizing the wire at the exit should preferably reduce the wire diameter by a relatively small amount, such that the ratio of the wire diameters before and after sizing is greater than approximately 0.9.

However, the method is also compatible with one or more wire-drawing steps at the exit.

The speed of treatment can be further improved if the vapor and gas contained in the furnace 1 are at a pressure higher than atmospheric pressure.

The zinc vapor in the furnace 1 is preferably saturated or supersaturated.

Figure 2:
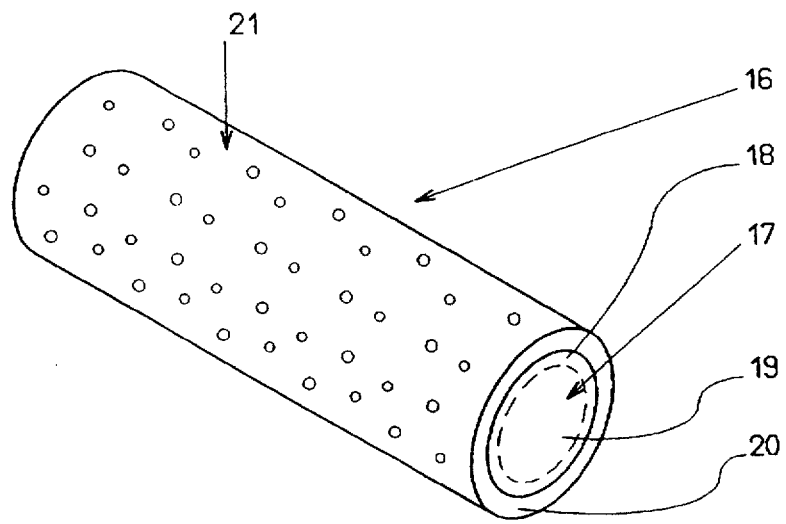
FIG. 2 is a diagrammatic perspective view showing a length of spark erosion electrode wire.

FIG. 2 is a diagram showing the structure of an electrode wire 16 obtained by the method of the invention.

This electrode wire comprises a core 17, which can either be entirely of homogeneous copper or copper alloy or include an outer layer 18 of copper or copper alloy around a core 19 of some other material, for example steel or aluminum or even a non-metallic material. The core 17 is covered with a thick layer 20 of diffused copper-zinc alloy, obtained from zinc vapor contained in the furnace 1 that is deposited and combined by diffusion with the copper or the copper alloy on the surface layer 18 of the core 17. A surface layer 20 of diffused copper-zinc alloy with a high zinc concentration and a thickness that can be in excess of 40 microns can be easily produced using the invention. A further increase in thickness is easily obtained by increasing the length of the furnace or by passing the wire through the furnace more than once.

On leaving the furnace 1, and prior to any sizing operation, the surface layer 20 has a slightly granular surface 21, as shown diagrammatically in FIG. 2, of a quality that is already suitable for use as a spark erosion electrode. Sizing by the die 15 reduces the granular nature of the outside surface 21 slightly, without it being necessary to reduce it by a significant amount, so that it is possible to use slight sizing, reducing the diameter of the wire and the thickness of the surface layer 20 by only a relatively very small amount.

Thanks to the speed of the method and the simplicity of the device for implementing it, the surface layer 20 may be formed continuously at the rate at which the wire is fed during spark erosion machining. It is therefore possible to place the device at the entry of a spark erosion machine, so that the input wire 7 is processed continuously on the entry side of the spark erosion machining area.

The present invention is not limited to the embodiment explicitly described, but includes variants and generalizations thereof within the scope of the following claims.

There is claimed:

1. Method of manufacturing spark erosion electrode wires wherein zinc is applied to at least one entry wire of copper or copper alloy or any other material covered with copper or copper alloy and a surface layer of diffused copper-zinc alloy is produced by thermal diffusion of zinc into the thickness of said copper or copper alloy of said entry wire using first and second heating means, which method comprises a step during which said entry wire is passed at least once through a furnace having an exit and containing zinc vapor in an inert atmosphere heated by said first heating means to a temperature greater than approximately 600° C. while said wire is simultaneously heated by additional heat input from said second heating means so that in said furnace its temperature rapidly rises to a value promoting diffusion of zinc into the thickness of said entry wire but less than the melting point of said entry wire, said step producing directly, after cooling at said exit from said furnace, said wire with a surface layer of diffused copper-zinc alloy.

2. Method according to claim 1 wherein said additional heat input is obtained by the Joule effect by passing an appropriate electrical current through the portion of said wire passing through said furnace.

3. Method according to claim 1 wherein, at said exit from said furnace containing zinc vapor in an inert atmosphere, said wire is heated continuously for a further time period to increase the diffusion of zinc.

4. Method according to claim 1 wherein before it enters said furnace said entry wire is pre-heated to an appropriate temperature to prevent the condensation of zinc on said wire when it enters said furnace.

5. Method according to claim 1 wherein when it passes through said furnace said wire is heated to red heat.

6. Method according to claim 1 wherein the temperature of said furnace is chosen, in accordance with the wire feed rate, to enable heating of said wire passing through it to a temperature between 700° C. and 800° C., advantageously close to 750° C.

7. Method according to claim 1 comprising a preliminary step of degreasing or cleaning said entry wire by chemical or electrochemical means before it enters said furnace.

8. Method according to claim 1 wherein said entry wire has a diameter substantially equal to a required final diameter of said electrode wire at said exit.

9. Method according to claim 8 wherein after passing through said furnace said wire is subject to a mechanical sizing operation reducing its diameter by a relatively small amount.

10. Method according to claim 1 wherein said vapor and gas contained in said furnace are at a pressure greater than atmospheric pressure.

* * * * *